Feb. 6, 1968 W. N. SHAUNFIELD 3,368,113

INTEGRATED CIRCUIT STRUCTURES, AND METHOD OF MAKING SAME, INCLUDING A DIELECTRIC MEDIUM FOR INTERNAL ISOLATION

Filed June 28, 1965

INVENTOR.
Wallace N. Shaunfield
BY
Gordon H. Telfer
ATTORNEY 3,368,113
Patented Feb. 6, 1968

3,368,113

INTEGRATED CIRCUIT STRUCTURES, AND METHOD OF MAKING SAME, INCLUDING A DIELECTRIC MEDIUM FOR INTERNAL ISOLATION

Wallace N. Shaunfield, Richardson, Tex., assignor to Westinghouse Electric Corporation, Pittsburgh, Pa., a corporation of Pennsylvania Filed June 28, 1965, Ser. No. 467,245
4 Claims. (Cl. 317—101)

ABSTRACT OF THE DISCLOSURE

An integrated circuit with dielectric isolation, and method of forming the same, having a metal layer between the device portions and the isolation medium for providing low saturation resistance and fast switching in transistor elements.

Figure 1:
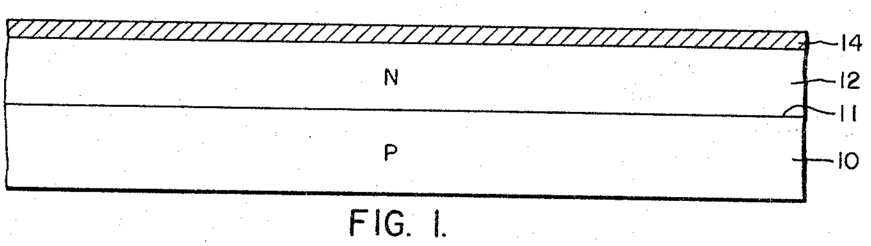

This invention relates generally to integrated circuits and methods for their fabrication and, more particularly, to integrated circuits wherein electronic elements are provided within bodies of semiconductor material that are isolated by a dielectric medium.

It has been previously proposed to improve electrical isolation, in both AC and DC senses, between device portions of semiconductor integrated circuits by employing a dielectric medium such as silicon dioxide. An example of such integrated circuits and methods for their fabrication are disclosed in copending application Ser. No. 444,208, filed Mar. 31, 1965, by B. D. Joyce and assigned to the assignee of the present invention.

In another aspect of integrated circuit technology, it has become common to fabricate transistor structures in such a manner that the transistor collector region is characterized by including portions of differing resistivity. At the base-collector junction the resistivity within the collector region is relatively high while underlying that portion of the collector and, sometimes, extending from the underlying portion of the collector to the surface of the integrated circuit is a portion of relatively low resistivity, that is, at least about an order of magnitude less than the portion at the collector junction. The purposes of this configuration are to minimize the collector saturation resistance, to provide sharp transistor switching characteristics, and to shorten switching time. For further information with respect to prior art structures for the minimization of collector saturation resistance in integrated circuits reference should be made to copending application Serial No. 353,524, filed March 20, 1964, by Husher et al. and assigned to the assignee of the present invention.

It is an object of the present invention to provide integrated circuit structures, and methods of making them, wherein improved internal isolation is achieved by employing a dielectric medium and transistor saturation resistance is minimized even further than previously possible.

Another object is to provide an improved integrated circuit structure, and method of making the same, that provides improved transistor structures while being completely compatible with existing techniques for the formation of other electronic elements within the integrated circuit.

The invention, in brief summary, achieves the aforementioned and additional objects and advantages by providing a structure that includes a plurality of separate portions of semiconductor material on a unitary support member. A layer of insulating material is positioned between the support member and each of the plurality of separate portions and a layer of a metal is positioned between the insulating layer and the separate portions so that in those portions in which transistor structures are fabricated, the metal layer minimizes the collector saturation resistance.

Preferably the support member is of coherent polycrystalline semiconductive material and the insulating layer is of a material such as silicon dioxide. In accordance with this invention, a plurality of separate portions of essentially monocrystalline epitaxially grown semiconductive material are formed on the body of starting material and a layer of metal is formed on each of the epitaxial portions following which a layer of insulating material is deposited on the layer of metal and exposed portions of the epitaxial portions. Then the support member of polycrystalline semiconductive material is deposited upon the layer of insulating material; the body of starting material is removed and electronic elements are formed in the plurality of separate portions.

Figure 2:
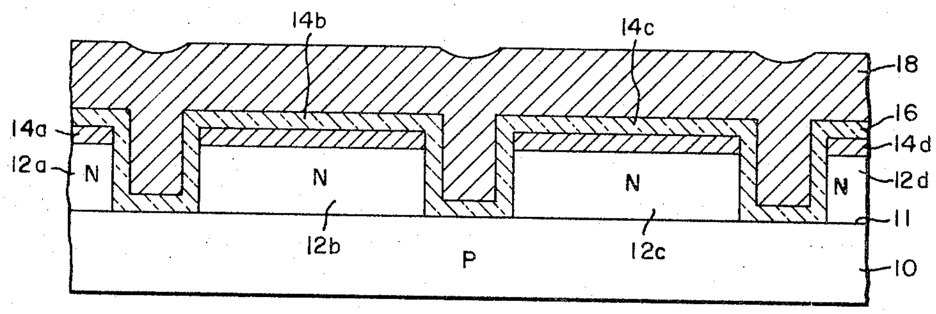
Figure 3:
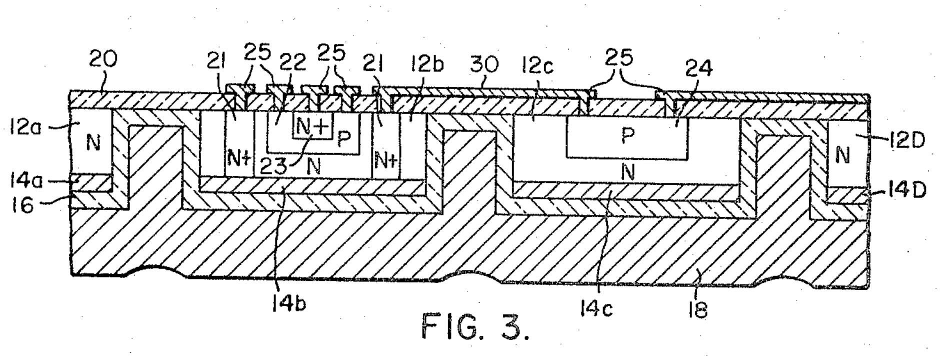

The invention, together with the above-mentioned and additional objects and advantages thereof will be better understood by reference to the following description taken with the accompanying drawing, wherein:

FIGURES 1 to 3 are partial sectional views of an integrated circuit at various stages in the fabrication process.

The invention will be described in connection with an example of a method of fabrication. It should be understood that the structure, in accordance with the present invention including a metal layer within device portions separated by a dielectric medium, may be achieved in other ways.

The figures of the drawing are not to scale and have been greatly exaggerated in some dimensions for clarity. In describing the invention, the various regions of the structure are designated as being of particular types of semiconductivity, however, it is to be understood that the semiconductivity type of various regions may be reversed from that shown.

The description particularly concerns the fabrication of an integrated circuit employing silicon as the semiconductive material because techniques of epitaxial growth, selective diffusion, etching and others are well known for silicon. However, the invention extends to the use of other semiconductive material.

In FIG. 1 there is shown a body of starting material 10 having on a first planar surface 11 thereof a layer of epitaxially grown material 12. On the exposed surface of the epitaxial layer 12 is disposed a layer of metal 14. The starting material 10 and epitaxial layer 12 are of device quality material, that is, essentially monocrystalline.

The starting material is of arbitrary thickness primarily chosen for convenience in handling. To readily permit the epitaxial growth of the layer 12 it is chosen preferably to be of near $<111>$ orientation. As illustrated, it is preferred that the starting material be of opposite semiconductivity type to that of the epitaxial layer as will be better understood in the description of subsequent operations. The semiconductivity type of the epitaxial layer is chosen in accordance with the type of material desired in the isolated portions of the ultimate integrated circuit. Also, the thickness of the epitaxial layer 12 is chosen in accordance with the thickness of the device portions desired in the ultimate integrated circuit.

Merely as an example, the starting material 10 may have a thickness of about 5 mils to provide adequate mechanical strength. Its resistivity is not critical and it may be as an example within the range from about 0.01 to 10 ohms centimeters. To facilitate subsequent operations it is preferred that the resistivity of the starting material be relatively low.

The epitaxial layer 12 should have resistivity in accordance with that desired in collector regions at the collector junction in ultimate transistor structures such as within the range from about 0.1 to 10 ohms centimeters. The selected thickness is primarily determined by the breakdown voltage desired. Typical thickness for the epitaxial layer 12 is within the range from about 10 to 20 microns.

The metal layer 14 should be of a metal having a low resistivity although any metal will provide improvement over prior art structures. The metal layer should also be of a material that will withstand the temperatures reached in subsequent steps and which will form and maintain an ohmic contact with the adjacent material of the epitaxial layer 12. Also, the thermal expansion coefficient of the metal layer 12 should be close to that of the epitaxial layer 12. It should also be of a metal that may be deposited easily, such as by evaporation or sputtering. It should also, in the practice of the method illustrated, chemically etch at about the same rate as the semiconductive material, which is silicon in this example. The metal layer 14 should also be of material that does not act as a dopant in the semiconductive material of layer 12 in a manner that adversely affects the formation and operation of electronic functional elements.

In addition, you must be able to place an oxidizing layer over it. Suitable metals that may be employed for the metal layer 14 include, but are not limited to, molybdenum, tungsten, platinum, tantalum and rhodium. It is also suitable that alloys of elemental metals be employed. A thin metal layer, of for example 1 to 10 microns in thickness, will provide substantial improvement in collector saturation resistance and not unduly disturb the mechanical structure as by the difference in thermal expansion coefficients. A metal layer having a plurality of successive layer portions chosen for different qualities such as ease of ohmic contacting (Au, for example), and minimization of thermal stress (Mo or W, for example) is also suitable.

FIG. 2 shows the structure after the epitaxial layer 12 and the metal layer 14 have been divided, by grooves extending completely therethrough, to form the separate portions 12A, 12B, 12C and 12D of the epitaxial layer and 14A, 14B, 14C and 14D of the metal layer.

The subdivision of the epitaxial layer and the metal layer are in a configuration conforming to that of the desired device portions in the ultimate integrated circuit. The separation may be performed using conventional photoresist techniques using one or more etching solutions to separate the metal layer 14 and the epitaxial layer 12.

It is also suitable to separate the epitaxial layer 12 prior to deposition of the metal layer. The metal layer may be deposited through a mask in the desired configuration. If deposited after epitaxial layer separation it may cover all the exposed surfaces of the epitaxial layer portions for even more effective saturation resistance minimization. It is desirable at some point that the metal layer 14 be alloyed, or at least sintered, to the epitaxial layer 12 to provide good mechanical adhesion and a good ohmic contact. This should preferably be performed following deposition of the metal layer 14 before other operations are performed.

Following the separation of the epitaxial layer 12 and the metal layer 14 there is formed or deposited a layer 16 of insulating material, preferably silicon dioxide, to a thickness of a few thousand angstroms over all the exposed surfaces of the epitaxial layer and the metal layer. This may be performed by a pyrolitic reaction such as the reaction of silicon tetrachloride with carbon dioxide in a hydrogen ambient at a temperature of about 1200° C. Its thickness may be between about 2,000 to 8,000 angstroms. Following the pyrolitic oxide formation, and conveniently in the same reaction chamber, a support member 18 is formed of polycrystalline silicon material formed by an epitaxial growth reaction. While the body 18 is referred to as polycrystalline material it is to be understood that its crystallinity is not critical and it serves merely as a support member. The support member 18 is formed in a coherent body to a thickness of about 6 to 8 mils for mechanical stability.

Following the formation of the support member further operations are performed to achieve the structure illustrated in FIG. 3. First is the removal of the p-type starting material 10 so as to provide access to the surface of the device portions 12A, 12B, 12C and 12D. This may be performed by the use of a selective etchant that attacks p-type silicon more readily than n-type material so that the termination of etching can be controlled by an electrical conductivity type test that indicates when n-type material is reached. An example of a suitable preferential etchant that attacks p-type silicon preferentially is an aqueous solution of potassium permanganate and hydrofluoric acid in accordance with the teachings of the Landgren Patent No. 2,847,287, Aug. 12, 1958, which should be referred to for further details.

The subsequent process steps may be in accordance with prior technology involving the use of oxide masks for the selective diffusion of impurities within the silicon. It will be noted in FIG. 3 that the structure is inverted from that illustrated in FIGS. 1 and 2.

In the separate portions 12A, 12B, 12C and 12D there may be fabricated any of the electronic elements such as transistors, diodes, capacitors, resistors that were possible in accordance with prior art technology. Merely as an example, there is illustrated in the isolated portion 12B a transistor structure including as the collector region the starting material 12B and also a more highly doped wall of material 21 extending from the surface of the integrated circuit to the metal layer 14B providing a low resistance path for carriers. The transistor also includes a base region 22 of p-type semiconductivity and an emitter region 23 that is highly doped N+ material. In the isolated portion 12C is formed a resistor region by the diffusion of a p-type material to form region 24, preferably in the same diffusion operation as that in which the p-type region 22 is formed.

In the transistor structure contacts 25 are disposed on each of the referred to regions. In the resistor structure contacts 25 are disposed at the extremities of the region 24. Conductive interconnection 30 is illustrated as connecting the collector of the transistor structure to one terminal of the resistor and is merely indicative of the integrated nature of the structure. Naturally a typical integrated circuit would include numerous additional electronic elements disposed in other separate portions of device quality material which would be interconnected by conductive pathways disposed over the insulating layer 20 that may conveniently be of silicon dioxide.

In prior art structures the transistor structures appeared similar to that illustrated in FIG. 3, instead of the metallic layer 14B there was a layer of semiconductive material that was relatively highly doped. The highly doped layer underlying the collector was often referred to as a "floating collector region." However, the sheet resistivity of the previous "floating collector" was typically of about 40 to 80 ohms per square. To further decrease the resistivity by increasing the doping level would result in considerable out-diffusion during subsequent operations. This would result in the collector-base junction breakdown voltage being reduced and the inverse current gain of the transistor structure being increased. In the structure in accordance with this invention, the sheet resistivity of the metallic floating collector is negligible, typically a reduction of a factor of about 1000 compared with that existing in prior structures. Also, there is no problem of diffusing impurities out of the metallic region as the metal may be chosen so as not to diffuse throughout the semiconductor structure during the subsequent operations. The overall improvement in collector saturation resistance is by a factor of about 5 to 10 over the previous method of transistor structure fabrication in integrated circuits.

While the invention has been shown and described in a few forms only, it will be understood that various changes and modifications may be made without departing from the spirit and scope thereof.

What is claimed is:

1. A semiconductor structure comprising: a plurality of separate portions of semiconductive material; a unitary support member for said plurality of separate portions; a first layer of insulating material positioned between said support member and said plurality of separate portions; a second layer of metal disposed between said first layer and at least a portion of each of said plurality of separate portions.

2. A semiconductor structure in accordance with claim 1 wherein: each of said plurality of separate portions contains an electronic semiconductor element of which at least one is a junction transistor.

3. A semiconductor integrated circuit structure comprising: a support member of coherent polycrystalline semiconductor material having a plurality of depressions in one surface thereof; a layer of insulating material lining each of said plurality of depressions; a layer of metal disposed on said layer of insulating material at the bottom of at least one of said depressions; a plurality of separate bodies of device quality semiconductor material, one of said bodies disposed in each of said depressions, all of said bodies having a surface lying in a common plane; an electronic element disposed within each of said separate bodies, at least one electronic element being a junction transistor in said body disposed within said depression having said layer of metal therein to provide reduced transistor saturation resistance while maintaining substantially complete electrical isolation between said separate bodies.

4. The subject matter of claim 3 wherein: said layer of metal consists essentially of at least one member of the group consisting of molybdenum, tungsten, platinum, tantalum and rhodium, and alloys thereof.

References Cited

UNITED STATES PATENTS

| | | | |
|---|---|---|---|
| 3,206,647 | 9/1965 | Kahn | 317—101 |
| 3,295,031 | 12/1966 | Schmitz | 317—101 |
| 3,312,871 | 4/1967 | Seki et al. | 317—101 |

OTHER REFERENCES

Electronic design, "Silicon Integrated Circuits Steal the Show," vol. 12, No. 8, pp. 12–14, April 13, 1964.

IBM technical disclosure bulletin, E. Stern, "Planar Scanistors Arrays," April 11, 1965, vol. 7, No. 11.

ROBERT K. SCHAEFER, *Primary Examiner.*

J. R. SCOTT, *Assistant Examiner.*